United States Patent
Min

(10) Patent No.: US 11,244,720 B2
(45) Date of Patent: Feb. 8, 2022

(54) ELECTRONIC DEVICE AND OPERATING METHOD OF ELECTRONIC DEVICE

(71) Applicant: Kookmin University Industry Academy Cooperation Foundation, Seoul (KR)

(72) Inventor: Kyeong-Sik Min, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 0 days.

(21) Appl. No.: 17/012,268

(22) Filed: Sep. 4, 2020

(65) Prior Publication Data

US 2021/0217469 A1    Jul. 15, 2021

(30) Foreign Application Priority Data

Jan. 9, 2020    (KR) .................. 10-2020-0003192
Aug. 11, 2020    (KR) .................. 10-2020-0100695

(51) Int. Cl.
*G11C 11/56*    (2006.01)
*G11C 7/10*    (2006.01)
(Continued)

(52) U.S. Cl.
CPC .............. *G11C 11/56* (2013.01); *G06N 3/063* (2013.01); *G11C 7/1006* (2013.01);
(Continued)

(58) Field of Classification Search
CPC ...... G11C 11/56; G11C 7/1078; G11C 7/1006; G11C 11/21; G11C 5/06; G06N 3/063
See application file for complete search history.

(56) References Cited

U.S. PATENT DOCUMENTS 9,171,617 B1 * 10/2015 Park .................. G11C 13/0064
2007/0159867 A1 * 7/2007 Muraoka ............ G11C 13/0069
                                                                365/100
(Continued)

FOREIGN PATENT DOCUMENTS

KR    10-1282884 B1    7/2013
KR    10-2014-0033215 A    3/2014
KR    10-2019-0114212 A    10/2019

OTHER PUBLICATIONS

Khoa Van Pham et al., "Asymmetrical Training Scheme of Binary-Memristor-Crossbar-Based Neural Networks for Energy-Efficient Edge-Computing Nanoscale Systems", Micromachines, 2019, 10(2), 141.

(Continued)

*Primary Examiner* — Ajay Ojha
(74) *Attorney, Agent, or Firm* — Sughrue Mion, PLLC

(57) ABSTRACT

Disclosed is an operating method of an electronic device, which includes receiving input data, selecting a program voltage pattern corresponding to the input data from among a plurality of program voltage patterns for storing the input data in a memristor array circuit, and storing the input data in the memristor array circuit depending on the program voltage pattern thus selected. Each of the plurality of program voltage patterns includes a plurality of voltage pulses in which a pulse magnitude gradually increases over time.

18 Claims, 16 Drawing Sheets

(51) Int. Cl.
 G06N 3/063 (2006.01)
 G11C 5/06 (2006.01)
 G11C 11/21 (2006.01)
(52) U.S. Cl.
 CPC .............. *G11C 7/1078* (2013.01); *G11C 5/06* (2013.01); *G11C 11/21* (2013.01)

(56) References Cited

U.S. PATENT DOCUMENTS

2011/0299322 A1* 12/2011 Iijima ................ G11C 13/0007
 365/148
2021/0125667 A1* 4/2021 Sharma .................. G06N 3/063

OTHER PUBLICATIONS

Khoa Van Pham et al., "Defect-Tolerant Training of Neuromorphic Memristor Crossbars", The Institute of Electronics and Information Engineers, 2019.

Khoa Van Pham et al., "Defect-Tolerant and Energy-Efficient Training of Multi-Valued and Binary Memristor Crossbars for Near-Sensor Cognitive Computing", 2019 IEEE 13th International Conference on ASIC (ASICON), 2019.

Khoa Van Pham et al., "Defect-Tolerant Crossbar Training of Memristor Ternary Neural Networks", 2019 26th IEEE International Conference on Electronics, Circuits and Systems (ICECS), 2019.

Ying Xin et al., "Bistable electrical switching and nonvolatile memory effects by doping different amounts of GO in poly(9,9-dioctylfluorene-2,7-diyl)", The Royal Society of Chemistry, 2018, 8, pp. 6878-6886.

Ligang Gao et al., "Programming Protocol Optimization for Analog Weight Tuning in Resistive Memories", IEEE Electron Device Letters, vol. 36, No. 11, Nov. 2015, pp. 1157-1159 (3 pages total).

Khoa Van Pham et al., "Memristor Binarized Neural Networks", ResearchGate, Journal of Semiconductor Technology and Science, vol. 18, No. 5, Oct. 2018, pp. 568-577 (12 pages total).

* cited by examiner

○ 1S-1R [R=HRS]
● 1S-1R [R=LRS]

ELECTRONIC DEVICE AND OPERATING METHOD OF ELECTRONIC DEVICE

CROSS-REFERENCE TO RELATED APPLICATIONS

This application claims priority under 35 U.S.C. § 119 to Korean Patent Application Nos. 10-2020-0003192 filed on Jan. 9, 2020 and 10-2020-0100695 filed on Aug. 11, 2020, in the Korean Intellectual Property Office, the disclosures of which are incorporated by reference herein in their entireties.

BACKGROUND

Embodiments of the inventive concept described herein relate to an electronic device and an operating method of the electronic device, and more particularly, relate to an electronic device capable of selecting a program voltage pattern corresponding to input data and storing data in a memristor array circuit by using the selected program voltage pattern and an operating method of the electronic device.

Conventionally, three types of circuit components (or elements) such as a resistor, an inductor, and a capacitor have been used. However, a memristor that is a fourth type of circuit component (or element) had been theoretically developed in 1972 by UC Berkeley researcher, Leon Chua.

The memristor that is a portmanteau of a memory and a resistor may remember the amount of current flowing therethrough.

The memristor is characterized in that the memristor remembers the amount and direction of current flowing immediately previously even in a state where a power is turned off. For this reason, the memristor is on the spotlight as a next-generation component (or element) capable of replacing a present flash memory.

The memristor may provide a low price, a high data processing speed, and a high density. Accordingly, the memristor may be utilized to manufacture a high-capacity memory.

Patent Document 1
Korean Patent Publication No. 10-2011-0020973 (Mar. 4, 2011)

SUMMARY

Embodiments of the inventive concept provide an electronic device capable of selecting a program voltage pattern corresponding to input data and storing data in a memristor array circuit by using the selected program voltage pattern and an operating method of the electronic device.

An operating method of an electronic device according to an embodiment of the inventive concept may include receiving input data, selecting a program voltage pattern corresponding to the input data from among a plurality of program voltage patterns for storing the input data in a memristor array circuit, and storing the input data in the memristor array circuit depending on the program voltage pattern thus selected. Each of the plurality of program voltage patterns may include a plurality of voltage pulses in which a pulse magnitude gradually increases over time.

In some embodiments, the selecting of the program voltage pattern may include selecting a first program voltage pattern when the input data have a first value, and selecting a second program voltage pattern when the input data have a second value.

In some embodiments, when the input data have the first value, a corresponding cell of the memristor array circuit is programmed to a high resistance state (HRS), and when the input data have the second value, the corresponding cell of the memristor array circuit is programmed to a low resistance state (LRS).

In some embodiments, a voltage difference of voltage pulses adjacent in the first program voltage pattern may be greater in value than a voltage difference of voltage pulses adjacent in the second program voltage pattern.

In some embodiments, a number of voltage pulses included in the first program voltage pattern may be less than a number of voltage pulses included in the second program voltage pattern.

In some embodiments, depending on values stored in two memristor cells adjacent at a same row of the memristor array circuit, a value stored in two memristor cells may be a value of "1", "0", or "−1".

In some embodiments, when all the two memristor cells are programmed to an HRS, the value stored in the two memristor cells may be "0". When a memristor cell placed on one side from among the two memristor cells is programmed to an LRS and a memristor cell placed on an opposite side from among the two memristor cells is programmed to the HRS, the value stored in the two memristor cells may be "1". When the memristor cell placed on the one side from among the two memristor cells is programmed to the HRS and the memristor cell placed on the opposite side from among the two memristor cells is programmed to the LRS, the value stored in the two memristor cells may be "−1".

In some embodiments, the two memristor cells may store at least a portion of a synaptic weight of a neural network.

In some embodiments, the selecting of the program voltage pattern may include selecting the program voltage pattern based on the input data and an input of a user.

In some embodiments, the selecting of the program voltage pattern may include selecting the program voltage pattern based on the input data and an operating mode.

In some embodiments, the operating mode may be determined as one of a high-accuracy operating mode or a low-accuracy operating mode, depending on a quality of service (QoS) required with regard to the electronic device.

In some embodiments, a first voltage difference of voltage pulses consecutive in a program voltage pattern selected in the low-accuracy operating mode from among the plurality of program voltage patterns may be greater in value than a second voltage difference of voltage pulses consecutive in a program voltage pattern selected in the high-accuracy operating mode from among the plurality of program voltage patterns.

An electronic device according to an embodiment of the inventive concept may include a memristor array circuit, and a memristor array controlling circuit that stores input data in the memristor array circuit depending on a program voltage pattern, which is selected to correspond to the input data, from among a plurality of program voltage patterns for storing the input data in the memristor array circuit. Each of the plurality of program voltage patterns may include a plurality of voltage pulses in which a pulse magnitude gradually increases over time.

In some embodiments, a first voltage difference of voltage pulses belonging to a first program voltage pattern of the plurality of program voltage patterns and adjacent to each other on the basis of time may be different from a second voltage difference of voltage pulses belonging to a second program voltage pattern of the plurality of program voltage patterns and adjacent to each other on the basis of time.

In some embodiments, the memristor array controlling circuit may select one of a plurality of program schemes and may select a program voltage pattern corresponding to the input data from among program voltage patterns belonging to the selected program scheme.

In some embodiments, in the plurality of program schemes, at least one of a scheme of programming a memristor cell of the memristor array circuit to a high resistance state (HRS) and a scheme of programming the memristor cell to a low resistance state (LRS) may be variable.

In some embodiments, the memristor array controlling circuit may adjust a fine level of the selected program voltage pattern.

In some embodiments, after the input data are stored in the memristor array circuit, the memristor array controlling circuit may calculate second input data and at least a portion of the input data stored in the memristor array circuit.

In some embodiments, the memristor array controlling circuit may calculate a result of the calculation as third input data and at least another portion of the input data stored in the memristor array circuit.

An electronic system according to an embodiment of the inventive concept may include a memory device that stores data, a processor that uses the memory device as a working memory, and a neural network system that performs learning or inference by using the data stored in the memory device depending on a request of the processor. The neural network system may include a memristor array circuit, and a memristor array controlling circuit that stores input data in the memristor array circuit depending on a program voltage pattern, which is selected to correspond to the input data, from among a plurality of program voltage patterns for storing the input data in the memristor array circuit. Each of the plurality of program voltage patterns may include a plurality of voltage pulses in which a pulse magnitude gradually increases over time.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
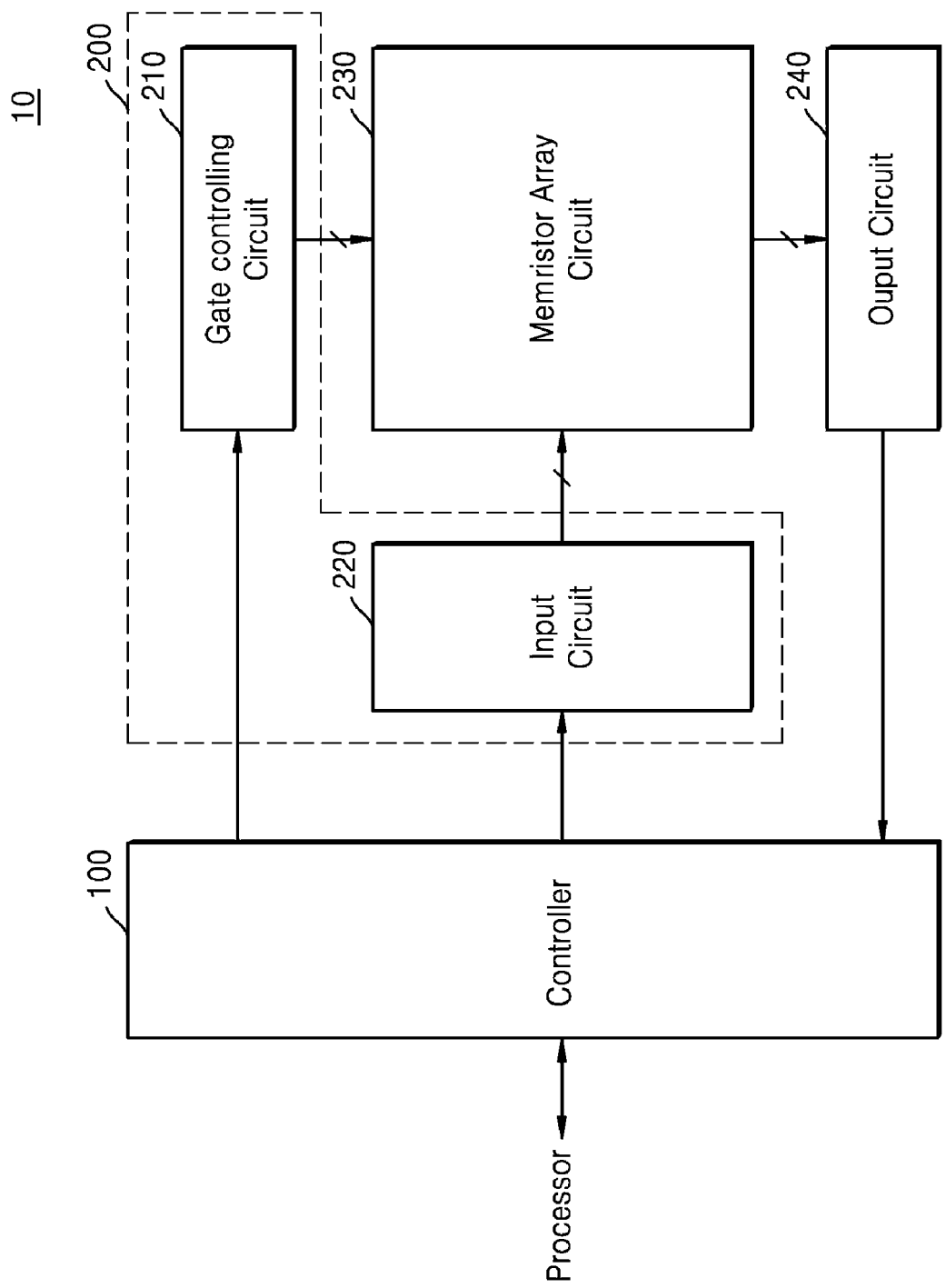
FIG. 1 is a block diagram of a memory device according to an embodiment of the inventive concept.

While the inventive concept is susceptible to various modifications and alternative forms, specific embodiments thereof are shown by way of example in the drawings and will herein be described in detail. It should be understood, however, that there is no intent to limit the inventive concept to the particular forms disclosed, but in contrast, the inventive concept is to cover all modifications, equivalents, and alternatives falling within the spirit and scope of the inventive concept.

In describing the scope and spirit of the inventive concept, when it is determined that the specific description of the known related art unnecessarily obscures the gist of the inventive concept, the detailed description thereof will be omitted. Numeral figures (e.g., 1, 2, etc.) used during describing the specification are just identification symbols for distinguishing one element from another element.

Also, in the specification, when expressed as a first component is "connected with" a second component, the first component will be directly connected with the second component. However, unless otherwise mentioned, it should be understood as the first component is connected with the second component with any other component interposed therebetween.

In addition, terms such as "unit", "module", and the like refer to units that perform at least one function or operation, and the units may be implemented with hardware, such as a processor, a microprocessor, a micro controller, a central processing unit (CPU), a graphics processing unit (GPU), an accelerate processor unit (APU), a drive signal processor (DSP), an application specific integrated circuit (ASIC), or a field programmable gate array (FPGA), software, or a combination of hardware and software. Alternatively, the units may be implemented with a memory that stores data necessary to process at least one function or operation.

In addition, a division of components in the specification is intended as divided only by the main function set for each component. That is, two or more components to be described hereinafter may be combined into a single component, or one component may be divided into two or more function blocks corresponding to subdivided functions. Furthermore, each of the components to be described hereinafter may additionally perform all or a part of functions of any other component as well as a main function thereof, and a part of main functions set for each component may be exclusively taken and certainly performed by any other component.

Figure 2:
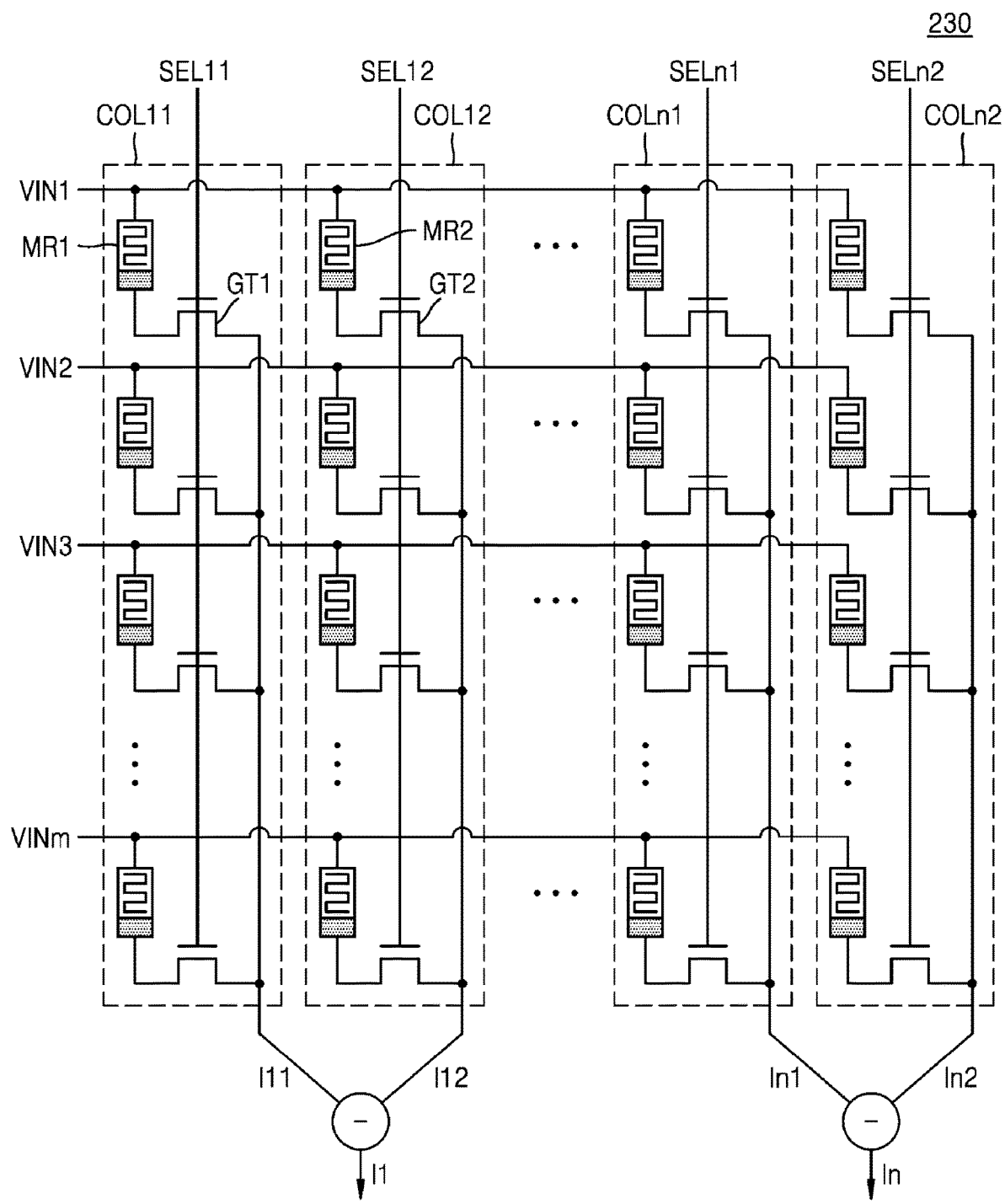
FIG. 2 is a circuit diagram according to an embodiment of a memristor array circuit illustrated in FIG. 1.
Figure 3:
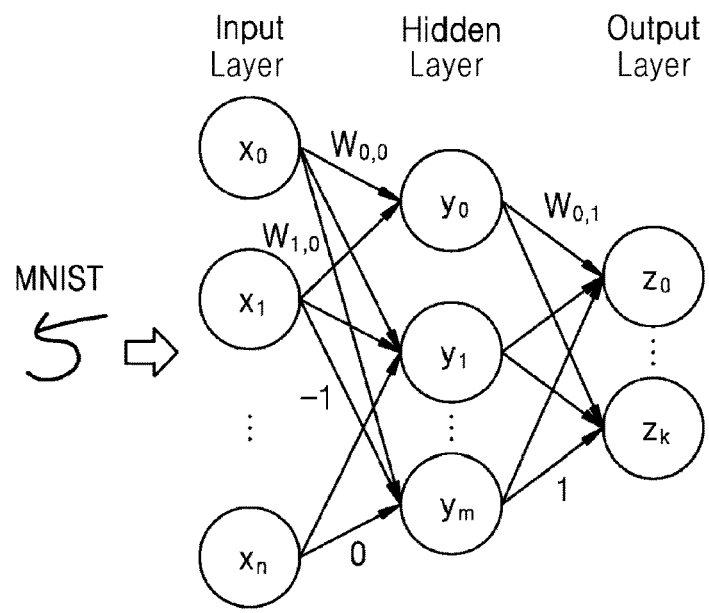
FIG. 3 a conceptual diagram of a multi-layer neural network according to an embodiment.

FIG. 1 is a block diagram of an electronic device 10 according to an embodiment of the inventive concept. FIG. 2 is a circuit diagram illustrating a memristor array circuit 230 illustrated in FIG. 1. FIG. 3 a conceptual diagram of a multi-layer neural network according to an embodiment.

Referring to FIG. 1, the electronic device 10 may include a controller 100, a memristor array controlling circuit 200, the memristor array circuit 230, and an output circuit 240.

The controller 100 may generate a control signal for programming input data input to the electronic device 10 in the memristor array circuit 230 and may transmit the control signal to the memristor array controlling circuit 200.

According to an embodiment, in a program operation, the controller 100 may select a program voltage pattern corresponding to the input data from among a plurality of program voltage patterns and may generate a control signal corresponding to the selected program voltage pattern.

The controller 100 may generate a control signal for reading data being stored in the memristor array circuit 230 and may transmit the control signal to the memristor array controlling circuit 200.

Data read from the memristor array circuit 230 depending on the control signal of the controller 100 may be output to the controller 100 through the output circuit 240.

The controller 100 may transfer the read data to a processor (not illustrated).

Also, the controller 100 may generate a control signal for calculating input data input to the electronic device 10 and data programmed in the memristor array circuit 230 and may transmit the control signal to the memristor array controlling circuit 200.

The controller 100 may transfer result data of the calculation to the processor. Alternatively, the controller 100 may perform an additional calculation by using the result data as new input data. Calculations that are repeated by the controller 100 or by the interaction between the controller 100 and the processor may be processes for inference. Among pieces of data programmed in the memristor array circuit 230, data used in a first calculation and data used in a second calculation may be different.

The memristor array controlling circuit 200 may include a gate controlling circuit 210 and an input circuit 220.

The gate controlling circuit 210 may generate and output selection signals SEL11 to SELn1 and SEL12 to SELn2 (refer to FIG. 2) for selecting memristor cells included in the memristor array circuit 230 depending on the control signal of the controller 100.

Depending on the control signal of the controller 100, the input circuit 220 may generate voltage patterns VIN1 to VINm (refer to FIG. 2) corresponding to input data and may provide the voltage patterns VIN1 to VINm to the memristor array circuit 230.

In the program operation, the memristor array circuit 230 may store input data under control of the controller 100. In calculation, the memristor array circuit 230 may calculate data stored in memristor cells and input data.

In the embodiments described above and in embodiments to be described below, at least a part of functions and operations mentioned as performed by the controller 100 may be performed by the memristor array controlling circuit 200. Also, at least a part of functions and operations mentioned as performed by the memristor array controlling circuit 200 may be performed by the controller 100. In an embodiment, the controller 100 and the memristor array controlling circuit 200 may be integrated into one block or may be divided into three or more blocks.

Referring together to FIGS. 1 and 2, the memristor array circuit 230 may include a plurality of memristor cells MR1, MR2, etc. arranged at intersections of 2n columns COL11 to COLn1 and COL12 to COLn2 and m rows; and gates GT1, GT2, etc. that are turned on or turned off depending on the selection signals SEL11 to SELn1 and SEL12 to SELn2 output from the gate controlling circuit 210 and select the plurality of memristor cells MR1, MR2, etc. The gates GT1, GT2, etc. may be, for example, transistors.

According to an embodiment, the plurality of memristor cells MR1, MR2, etc. included in the memristor array circuit 230 may constitute a binary memristor array in which a memristor cell is capable of being programmed to one of two states. For example, each of the plurality of memristor cells MR1, MR2, etc. may be programmed to a high resistance state (HRS) capable of storing input data corresponding to "0" or a low resistance state (LRS) capable of storing input data corresponding to "1".

According to an embodiment, a pair of memristor cells (e.g., MR1 and MR2) that are turned on or turned off depending on a pair of selection signals (e.g., SEL11 and SEL12) and are adjacent to each other at the same row may store a value of "1", "0", or "−1" through a combination of states of the memristor cells (e.g., MR1 and MR2).

For example, in the case where paired memristor cells (e.g., MR1 and MR2) are programmed to the HRS, a value stored in the paired memristor cells may be "0". In the case where a memristor cell (e.g., MR1) placed on one side from among the paired memristor cells (e.g., MR1 and MR2) is programmed to the LRS and a memristor cell (e.g., MR2) placed on an opposite side from among the paired memristor cells is programmed to the HRS, a value stored in the paired memristor cells MR1 and MR2 may be "1". In the case where a memristor cell (e.g., MR1) placed on one side from among the paired memristor cells (e.g., MR1 and MR2) is programmed to the HRS and a memristor cell (e.g., MR2) placed on an opposite side from among the paired memristor cells is programmed to the LRS, a value stored in the paired memristor cells MR1 and MR2 may be "−1".

According to an embodiment, a value of "1", "0", or "−1" stored in a pair of memristor cells (e.g., MR1 and MR2) may be a synaptic weight of a neural network.

A conceptual diagram of a multi-layer neural network to which the electronic device 10 according to an embodiment of the inventive concept is applicable is illustrated in FIG. 3. The multi-layer neural network may be divided into an input layer corresponding to a value that is first received, a hidden layer corresponding to an internal layer of processing the received value, and an output layer of outputting a result.

Each of elements $x_0$ to $x_n$, $y_0$ to $y_m$, and $z_0$ to $z_k$ of the respective layers may correspond to one neuron. Each of arrows connecting the neurons $x_0$ to $x_n$, $y_0$ to $y_m$, and $z_0$ to $z_k$ may correspond to one synapse.

Synaptic weights (e.g., ($W_{0,0}$), ($W_{1,0}$), and ($W_{0,1}$)) may be applied to synapses between the input layer, the hidden layer, and the output layer. According to an embodiment, each of the synaptic weights may have a value of "−1", "1", or "0".

That is, the electronic device 10 according to an embodiment of the inventive concept may store the synaptic weights (e.g., ($W_{0,0}$), ($W_{1,0}$), and ($W_{0,1}$)) of the multi-layer neural network, each of which has a value of "−1", "1", or "0".

Alternatively, each of the synaptic weights may be a floating point value or a fixed point value expressed by two or more bits. Each of the synaptic weights may be stored by using two or more pairs of memristor cells. A pair of memristor cells MR1 and MR2 may store one of bits of a synaptic weight.

In an embodiment, the multi-layer neural network may perform learning and inference by using a modified national institute of standards and technology (MNIST) dataset.

Returning to FIG. 2, an output signal that is output from the memristor array circuit 230 by the selection signal provided from the gate controlling circuit 210 and a read voltage provided from the input circuit 220 may be output to the output circuit 240.

Alternatively, in calculation, an output signal that is output from the memristor array circuit 230 by the selection signal provided from the gate controlling circuit 210 and a calculation voltage provided from the input circuit 220 may be output to the output circuit 240.

Output signals (e.g., I11 and I12) that are output from the paired memristor cells MR1 and MR2 turned on or turned off by a pair of selection signals (e.g., SEL11 and SEL12) and adjacent to each other at the same row may be output as an output signal (e.g., I1) through a subtraction operation (e.g., I11-I12).

In an embodiment, in calculation, pairs of memristor cells that are turned on or turned off by the paired selection signals SEL11 and SEL12 may perform a function corresponding to at least one neuron. Calculation voltages that are provided by the input circuit 220 may correspond to inputs associated with at least one neuron. One output signal I1 output from the pairs of memristor cells turned on or turned off by the paired selection signals SEL11 and SEL12 may correspond to an output of at least one neuron.

Returning to FIG. 1, the output circuit 240 may process the output signal I1 according to the subtraction operation and may output a data value corresponding to the output signal I1 to the controller 100 as a result of processing the output signal I1.

Figure 4:
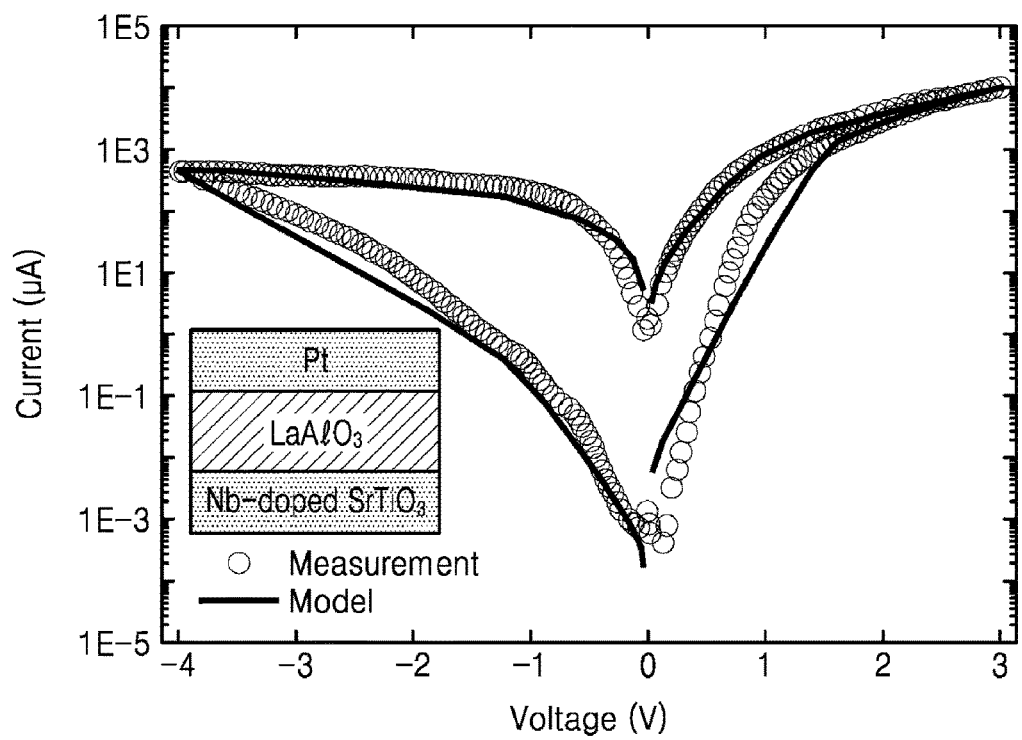
FIG. 4 is a graph illustrating the measurement and the model of a current-voltage relationship of a memristor cell.

FIG. 4 is a graph illustrating the measurement and the model of a current-voltage relationship of a memristor cell. In FIG. 4, a horizontal axis represents a voltage, and a unit of the voltage may be "V". A vertical axis represents a current, and a unit of the current may be "uA". Referring to FIG. 4, a memristor cell according to an embodiment of the inventive concept may be implemented in the form of a stacked film of Pt/LaAlO$_3$/Nb-doped SrTiO$_2$.

The graph of FIG. 4 may show the measurement (marked by a circle) and the model of a current flowing through a memristor cell depending on a voltage applied thereto, under the condition that the area of each of a top electrode (Pt) and a bottom electrode (SrTiO) is 100 um×100 um.

Figure 5:
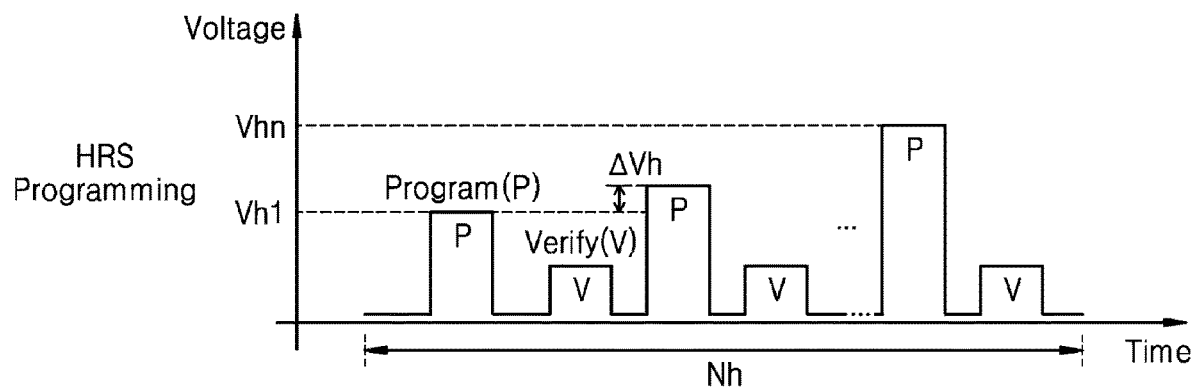
FIG. 5 is a diagram illustrating an embodiment of one of a plurality of program voltage patterns.

FIG. 5 is a diagram illustrating an embodiment of one of a plurality of program voltage patterns. In FIG. 5, a horizontal axis represents a time, and a vertical axis represents a voltage.

One of a plurality of program voltage patterns for programming a memristor cell to the HRS is illustrated in FIG. 5 by way of example.

A program voltage pattern may include a plurality of voltage pulses "P" in which a pulse magnitude (e.g., a pulse voltage level) gradually increases over time.

According to an embodiment, the program voltage pattern may include a plurality of voltage pulses "P" in which pulse duration (e.g., a pulse width) gradually increases over time (e.g., instead of a pulse magnitude).

According to an embodiment, the program voltage pattern may include a plurality of voltage pulses "P" in which a pulse magnitude and pulse duration (e.g., a pulse width) gradually increase over time.

According to an embodiment, the program voltage pattern may start from a voltage pulse "P" having a voltage value of "Vh1" (or a pulse width time value) and may end at a voltage pulse "P" having a voltage value of "Vhn" after a magnitude of the voltage pulse "P" having the voltage value of "Vh1" gradually increases as much as a given count.

According to an embodiment, a voltage difference ΔVh (or a pulse width time difference) of adjacent voltage pulses "P" in which a pulse voltage level increases over time may be uniform.

According to an embodiment, a voltage difference ΔVh (or a pulse width time difference) of adjacent voltage pulses "P" in which a pulse voltage level increases over time may be variable.

According to an embodiment, the program voltage pattern for programming a memristor cell to the HRS may include "Nh" voltage pulses "P".

According to an embodiment, the program voltage pattern for programming a memristor cell to the HRS may include the voltage pulses "P" having a positive voltage value.

The program voltage pattern may include the voltage pulses "V" for verify between the voltage pulses "P" for program. Whether input data are successfully programmed in a memristor cell may be determined by the voltage pulses "V" for verify. For example, an operation of verifying whether input data are successfully programmed in a memristor cell may include operations of applying the voltage pulse "V" for verify to a memristor cell and sensing the amount of current flowing through the memristor cell.

When the amount of current flowing through the memristor cell belongs to a target range, the memristor cell may be verified as successfully programmed. Afterwards, the programming of the memristor cell may be terminated. When the amount of current flowing through the memristor cell does not belong to the target range, the memristor cell may be verified as not successfully programmed. Afterwards, the voltage pulse "P" for program may again be applied to the memristor cell. In an embodiment, in some cases, all or a part of the voltage pulses "V" for verify may be omitted.

Figure 6:
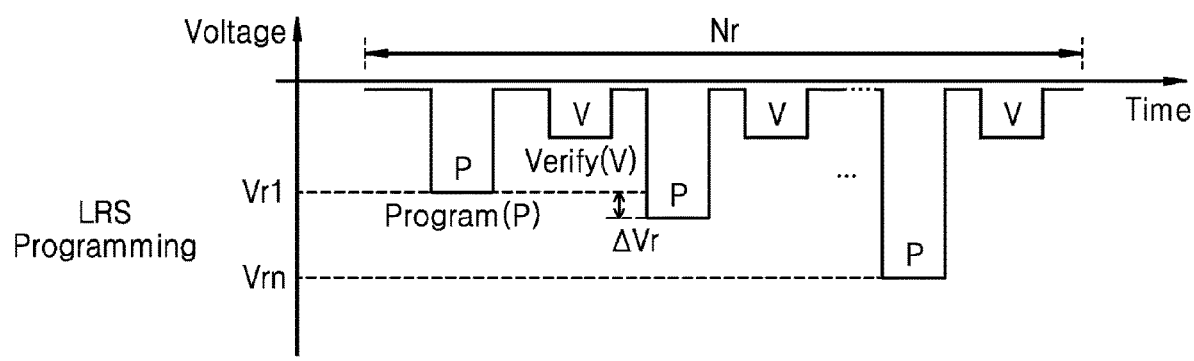
FIG. 6 is a diagram illustrating another embodiment of one of a plurality of program voltage patterns.

FIG. 6 is a diagram illustrating another embodiment of one of a plurality of program voltage patterns. In FIG. 6, a horizontal axis represents a time, and a vertical axis represents a voltage. One of a plurality of program voltage patterns for programming a memristor cell to the LRS is illustrated in FIG. 6 by way of example.

A program voltage pattern may include a plurality of voltage pulses "P" in which a pulse magnitude (e.g., an absolute value of a voltage level) gradually increases over time. That is, the program voltage pattern may include a plurality of voltage pulses "P" (e.g., negative voltage pulses) in which a level gradually decreases over time.

According to an embodiment, the program voltage pattern may include a plurality of voltage pulses "P" in which pulse duration (e.g., a pulse width) gradually increases over time (e.g., instead of a pulse magnitude). That is, the program voltage pattern may include a plurality of voltage pulses "P" (e.g., negative voltage pulses) in which pulse duration (e.g., a pulse width) gradually increases over time.

According to an embodiment, the program voltage pattern may include a plurality of voltage pulses "P" in which a pulse magnitude (e.g., an absolute value of a voltage level) and pulse duration (e.g., a pulse width) gradually increase together over time.

According to an embodiment, the program voltage pattern may start from a voltage pulse "P" having a voltage value of "Vr1" (or a pulse width time value) and may end at a voltage pulse "P" having a voltage value of "Vrn" after a magnitude (e.g., an absolute value of a voltage level) of the voltage pulse "P" having the voltage value of "Vr1" gradually increases as much as a given count.

According to an embodiment, a voltage difference ΔVr (or a pulse width time difference) of adjacent voltage pulses "P" in which an absolute value of a voltage level increases over time may be uniform.

According to an embodiment, a voltage difference ΔVr (or a pulse width time difference) of adjacent voltage pulses "P" in which an absolute value of a voltage level increases over time may be variable.

According to an embodiment, the program voltage pattern for programming a memristor cell to the LRS may include "Nr" voltage pulses "P".

According to an embodiment, the program voltage pattern for programming a memristor cell to the LRS may include the voltage pulses "P" having a negative voltage value.

The program voltage pattern may include the voltage pulses "V" for verify between the voltage pulses "P" for program. Whether input data are successfully programmed in a memristor cell may be determined by the voltage pulses "V" for verify. For example, an operation of verifying whether input data are successfully programmed in a memristor cell may include operations of applying the voltage pulse "V" for verify to a memristor cell and sensing the amount of current flowing through the memristor cell.

When the amount of current flowing through the memristor cell belongs to the target range, the memristor cell may be verified as successfully programmed. Afterwards, the programming of the memristor cell may be terminated. When the amount of current flowing through the memristor cell does not belong to the target range, the memristor cell may be verified as not successfully programmed. Afterwards, the voltage pulse "P" for program may again be applied to the memristor cell. In an embodiment, in some cases, all or a part of the voltage pulses "V" for verify may be omitted.

Referring together to FIGS. 5 and 6, the electronic device 10 may select a program voltage pattern corresponding to the received input data from among the plurality of program voltage patterns illustrated in FIGS. 5 and 6.

According to an embodiment, when input data have a first value (e.g., "0"), a first program voltage pattern (e.g., the program voltage pattern of FIG. 5) for programming a memristor cell to the HRS may be selected; when the input data have a second value (e.g., "1"), a second program voltage pattern (e.g., the program voltage pattern of FIG. 6) for programming a memristor cell to the LRS may be selected.

According to an embodiment, a voltage difference (e.g., ΔVh) (or a pulse width time difference) of the voltage pulses "P" in the first program voltage pattern (e.g., the program voltage pattern of FIG. 5) may have a relatively great value compared to a voltage difference (e.g., ΔVr) (or a pulse width time difference) of the voltage pulses "P" in the second program voltage pattern (e.g., the program voltage pattern of FIG. 6).

According to an embodiment, the number (e.g., Nh) of voltage pulses "P" in the first program voltage pattern (e.g., the program voltage pattern of FIG. 5) may be relatively less than the number (e.g., Nr) of voltage pulses "P" in the second program voltage pattern (e.g., the program voltage pattern of FIG. 6). That is, the programming of the memristor cell to the HRS may be completed to be faster than the programming of the memristor cell to the LRS.

Figure 7A:
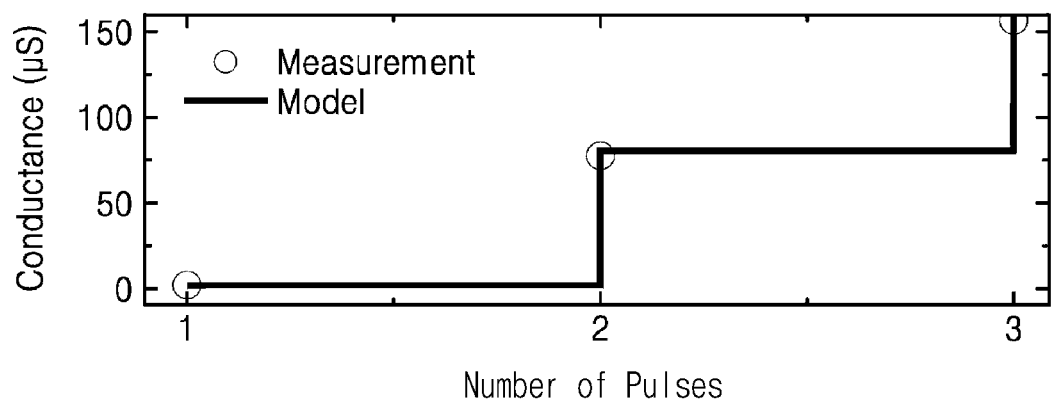
FIGS. 7A and 7B are graphs illustrating a conductance change of a memristor cell according to a first program voltage pattern.
Figure 7B:
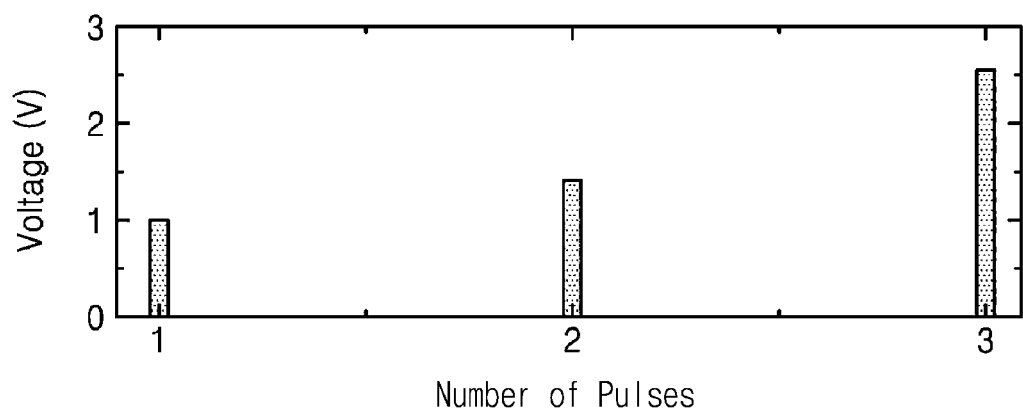
Figure 8A:
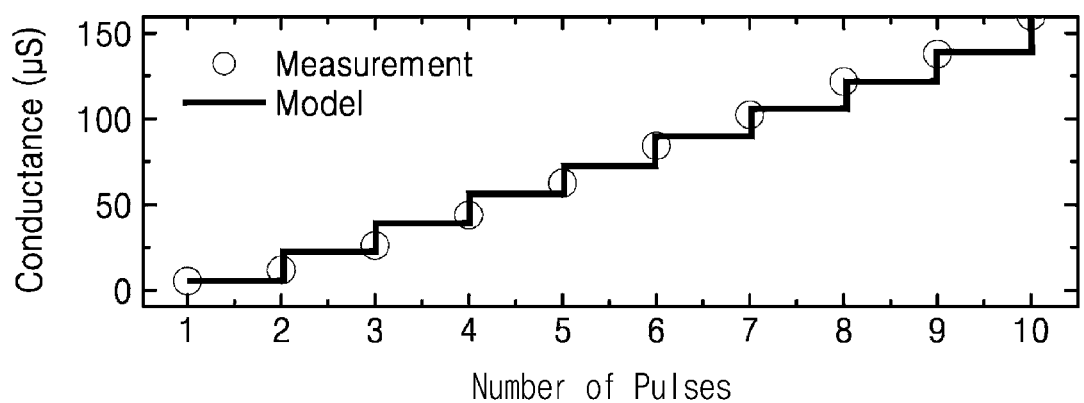
FIGS. 8A and 8B are graphs illustrating a conductance change of a memristor cell according to a second program voltage pattern.
Figure 8B:
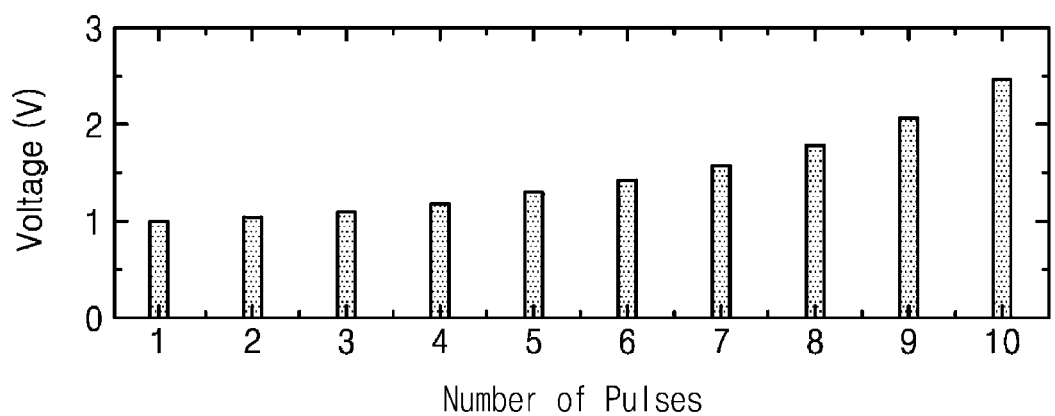
Figure 9A:
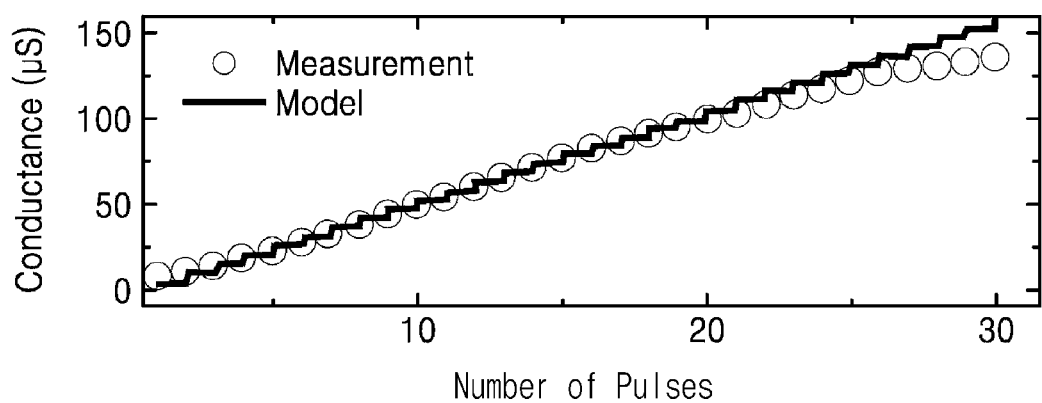
FIGS. 9A and 9B are graphs illustrating a conductance change of a memristor cell according to a third program voltage pattern.
Figure 9B:
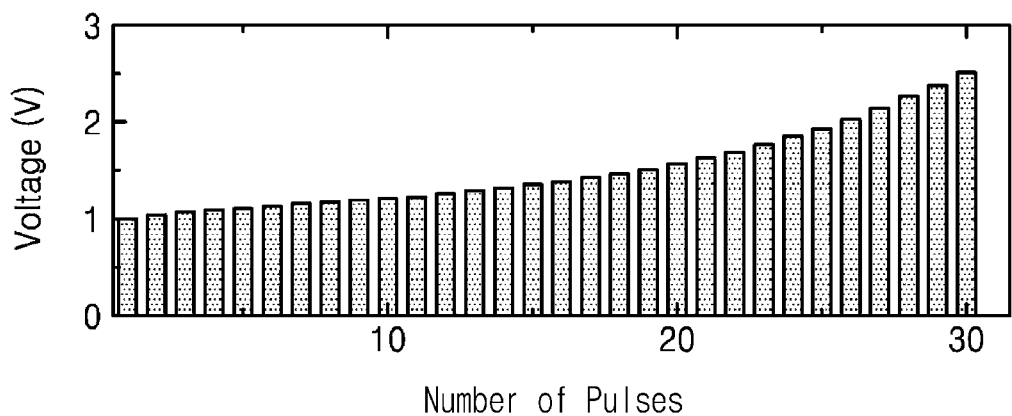

FIGS. 7A and 7B are graphs illustrating a conductance change of a memristor cell according to a first program voltage pattern. FIGS. 8A and 8B are graphs illustrating a conductance change of a memristor cell according to a second program voltage pattern. FIGS. 9A and 9B are graphs illustrating a conductance change of a memristor cell according to a third program voltage pattern.

In an embodiment, in FIGS. 7B, 8B, and 9B, the first program voltage pattern, the second program voltage pattern, and the third program voltage pattern may indicate absolute values of levels of voltage pulses. Because a conductance of a memristor cell increases as illustrated in FIGS. 7A, 8A, and 9A, the first program voltage pattern, the second program voltage pattern, and the third program voltage pattern of FIGS. 7B, 8B, and 9B may include voltage pulses of negative voltages illustrated in FIG. 6.

In an embodiment, when the first program voltage pattern, the second program voltage pattern, and the third program voltage pattern of FIGS. 7B, 8B, and 9B include voltage pulses of positive voltages illustrated in FIG. 5, a conductance of a memristor cell may decrease. In an embodiment, a conductance may be opposite to a resistance in meaning. An increase in a conductance may be considered as a decrease in a resistance, and a decrease in a conductance may be considered as an increase in a resistance.

FIGS. 7A and 7B, FIGS. 8A and 8B, and FIGS. 9A and 9B may indicate three types of different program voltage patterns in which the number of voltage pulses is variable, not uniform, and a voltage difference of adjacent voltage pulses is variable, not uniform.

In FIGS. 7A, 8A, and 9A, a horizontal axis represents the number of pulses, and a vertical axis represents a conductance of a memristor cell. A unit of a conductance may be "uS". In FIGS. 7B, 8B, and 9B, a horizontal axis represents the number of pulses, and a vertical axis represents a magnitude of a voltage pulse. A unit of the magnitude of the voltage pulse may be "V".

An example is illustrated as voltage pulse time intervals of program voltage patterns are different, but this is for comparing the program voltage patterns easily. For example, the inventive concept is not limited to the case where voltage pulse time intervals must be different for respective program voltage patterns.

The first program voltage pattern illustrated in FIG. 7B may include 3 voltage pulses. In the first program voltage pattern, a voltage difference between adjacent voltage pulses may be 0.75 V. The first program voltage pattern may be a program voltage pattern for programming a memristor cell at a relatively coarse level. In this case, as illustrated in FIG. 7A, the measurement (marked by a circle) and the model of a conductance of a memristor cell may have the variation of about 67 uS on average.

The second program voltage pattern illustrated in FIG. 8B may include 10 voltage pulses. In the second program voltage pattern, a voltage difference between adjacent voltage pulses may be 0.34 V. The second program voltage pattern may be a program voltage pattern for programming a memristor cell at a relatively moderate level. In this case, as illustrated in FIG. 8A, the measurement (marked by a circle) and the model of a conductance of a memristor cell may have the variation of about 15 uS on average.

The third program voltage pattern illustrated in FIG. 9B may include 30 voltage pulses. In the third program voltage pattern, a voltage difference between adjacent voltage pulses may be 0.05 V. The third program voltage pattern may be a program voltage pattern for programming a memristor cell at a relatively fine level. In this case, as illustrated in FIG. 9A, the measurement (marked by a circle) and the model of a conductance of a memristor cell may have the variation of about 4.4 uS on average.

The above expressions "coarse level", "moderate level", and "fine level" may be relative. When a voltage difference (or a time difference of pulse widths) of adjacent voltage pulses of a first program voltage pattern on the basis of time is smaller than a voltage difference (or a time difference of pulse widths) of adjacent voltage pulses of a second program voltage pattern on the basis of time, the first program voltage pattern may be a program voltage pattern of a fine level, and the second program voltage pattern may be a program voltage pattern of a coarse level.

A fine level or a coarse level of program voltage patterns may be expressed by using terms such as "finer", "less fine", "coarser", and "less coarse". A voltage difference (or a time difference of pulse widths) of adjacent voltage pulses of a "finer" or "less coarse" program voltage pattern on the basis of time may be smaller than a voltage difference (or a time difference of pulse widths) of adjacent voltage pulses of a "less fine" or "coarser" program voltage pattern on the basis of time.

A relationship between program voltage pulses of FIGS. 7A and 7B, FIGS. 8A and 8B, and FIGS. 9A and 9B may be similarly applied to the case where a memristor cell is programmed to the LRS, except that voltage pulses have negative levels and a change direction of a conductance is opposite to that of FIGS. 7A and 7B, FIGS. 8A and 8B, and FIGS. 9A and 9B. For example, when memristor cells are programmed to the LRS, a "coarser" program voltage pattern or a "finer" program voltage pattern may be used. As a program voltage pattern becomes finer, the number of change steps of a conductance of a memristor cell may increase.

Figure 10A:
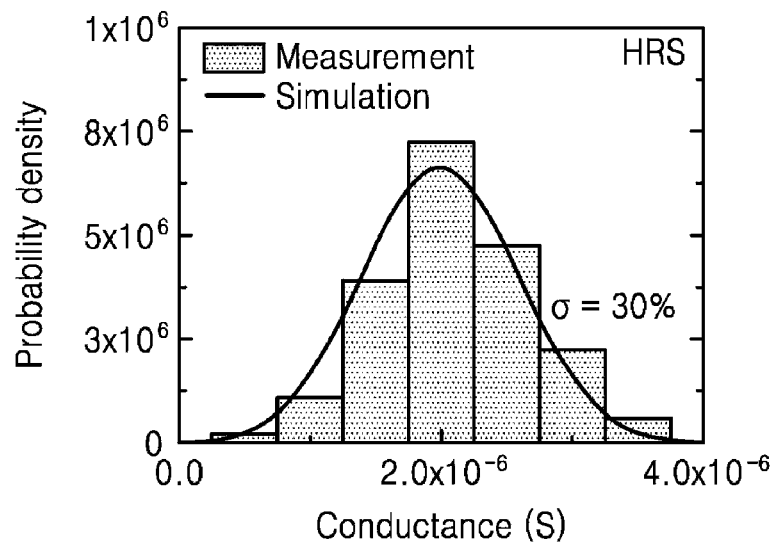
FIGS. 10A and 10B are graphs illustrating state distributions of memristor cells according to a first program voltage pattern.
Figure 10B:
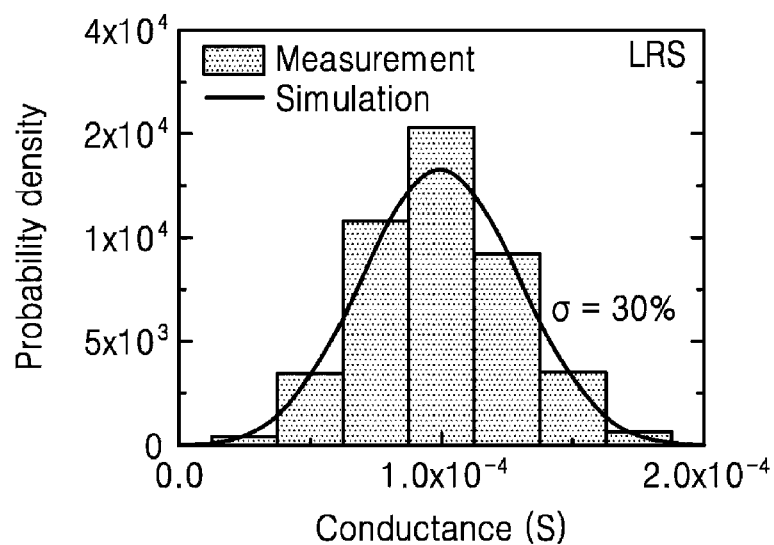
Figure 11A:
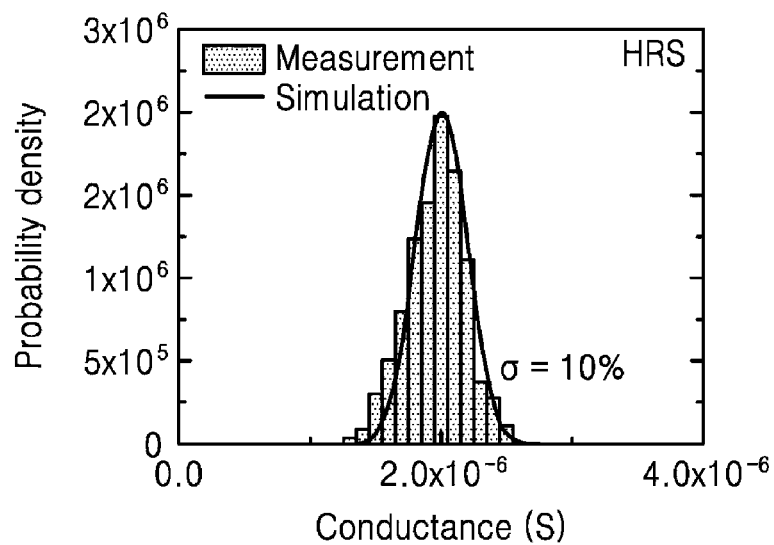
FIGS. 11A and 11B are graphs illustrating state distributions of memristor cells according to a second program voltage pattern.
Figure 11B:
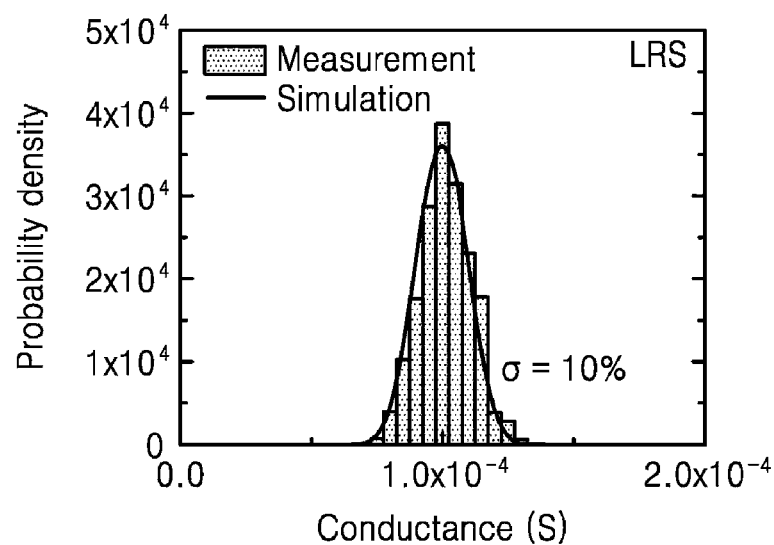
Figure 12A:
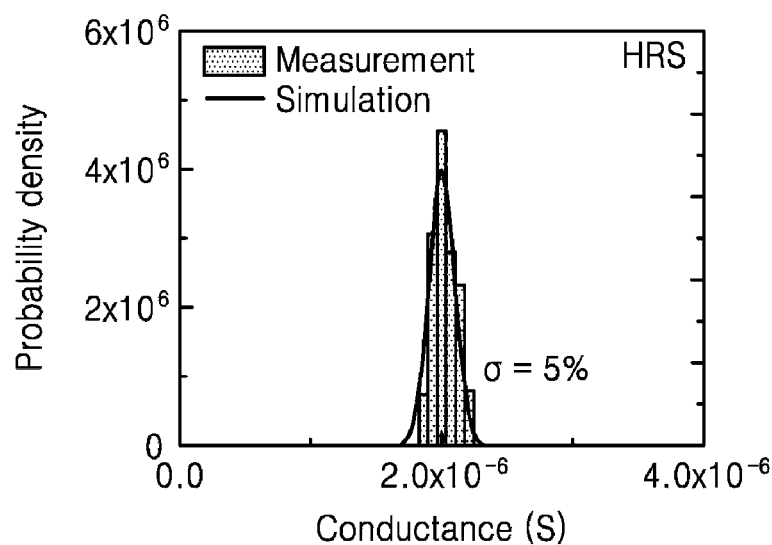
FIGS. 12A and 12B are graphs illustrating state distributions of memristor cells according to a third program voltage pattern.
Figure 12B:
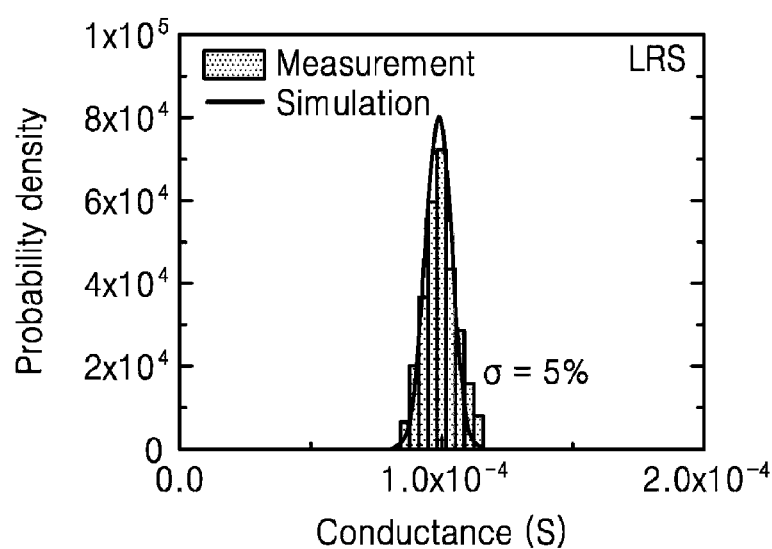

FIGS. 10A and 10B are graphs illustrating state distributions of memristor cells according to a first program voltage pattern. FIGS. 11A and 11B are graphs illustrating state distributions of memristor cells according to a second program voltage pattern. FIGS. 12A and 12B are graphs illustrating state distributions of memristor cells according to a third program voltage pattern.

FIGS. 10A, 11A, and 12A indicate state distributions of memristor cells programmed to the HRS. In FIGS. 10A, 11A, and 12A, a horizontal axis represents a conductance, and a vertical axis represents a probability density. A unit of a conductance may be "S".

FIGS. 10B, 11B, and 12B indicate state distributions of memristor cells programmed to the LRS. In FIGS. 10B, 11B, and 12B, a horizontal axis represents a conductance, and a vertical axis represents a probability density. A unit of a conductance may be "S".

It is observed from FIGS. 10A and 10B, FIGS. 11A and 11B, and FIGS. 12A and 12B that distributions of the measurement (filled by dots) and the model of memristor cells become denser in the order from the first program voltage pattern to the third program voltage pattern, for example, that a variance value σ decreases in the order from the first program voltage pattern to the third program voltage pattern (30%→10%→5%).

Figures 13, 14:
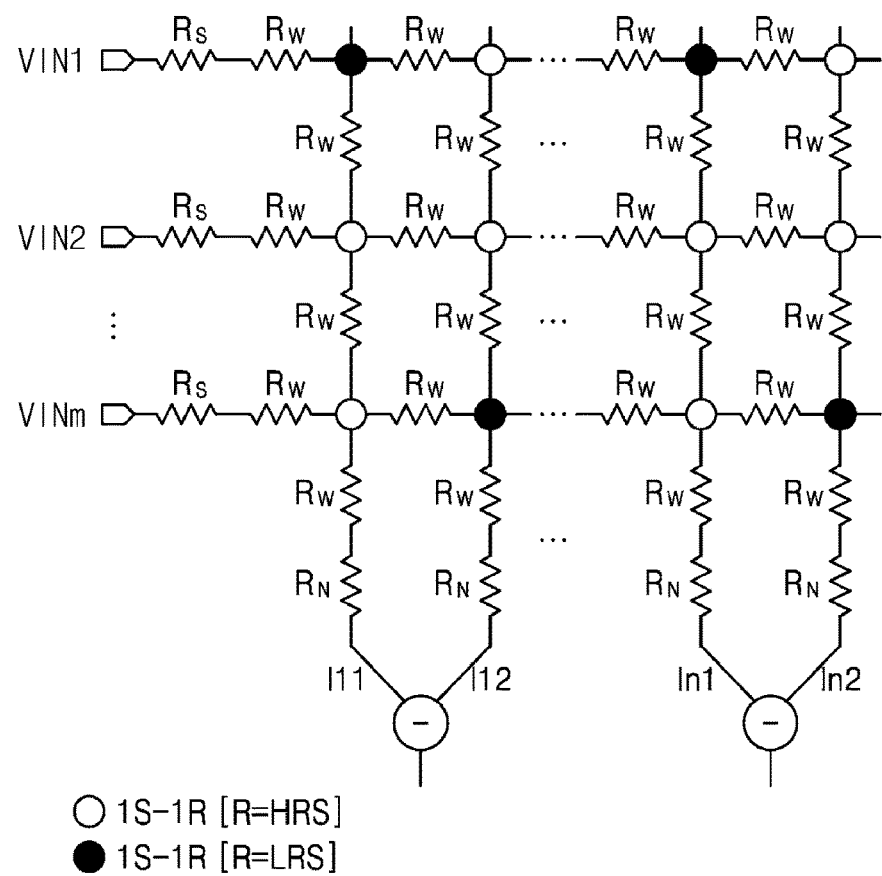
FIG. 13 is a diagram illustrating a MNIST (Modified National Institute of Standards and Technology) dataset for testing a performance of a memory device according to an embodiment of the inventive concept.
FIG. 14 is a circuit diagram of a binary-memristor array circuit including parasitic resistances $R_S$, $R_N$, and $R_W$, according to an embodiment of the inventive concept.

FIG. 13 is a diagram illustrating a MNIST (Modified National Institute of Standards and Technology) dataset for testing a performance of a memory device according to an embodiment of the inventive concept. Referring to FIG. 13, an MNIST dataset may include images of numbers written by hand.

FIG. 14 is a circuit diagram of a binary-memristor array circuit including parasitic resistances $R_S$, $R_N$, and $R_W$, according to an embodiment of the inventive concept.

According to an embodiment of the inventive concept, a circuit diagram of a binary-memristor array circuit including parasitic resistances is illustrated in FIG. 14. In FIG. 14, "$R_S$" that is a parasitic source resistance may indicate a parasitic resistance of a source driver that supplies the voltage patterns VIN1 to VINm corresponding to input data. "$R_N$" that is a parasitic sense resistance may indicate a resistance of a sensing circuit that senses a resistance value of a memristor cell. "$R_W$" that is a parasitic wire resistance may indicate a resistance of a wire that connects the source driver, the memristor cell, and the sensing circuit.

A white circle may indicate a memristor cell (IS-IR) implemented with one selector (e.g., a transistor) and one resistance element, in particular, a memristor cell in which the resistance element is in a high resistance state (HRS). A black circle may indicate a memristor cell (IS-IR) implemented with one selector and one resistance element, in particular, a memristor cell in which the resistance element is in a low resistance state (LRS).

Figure 15A:
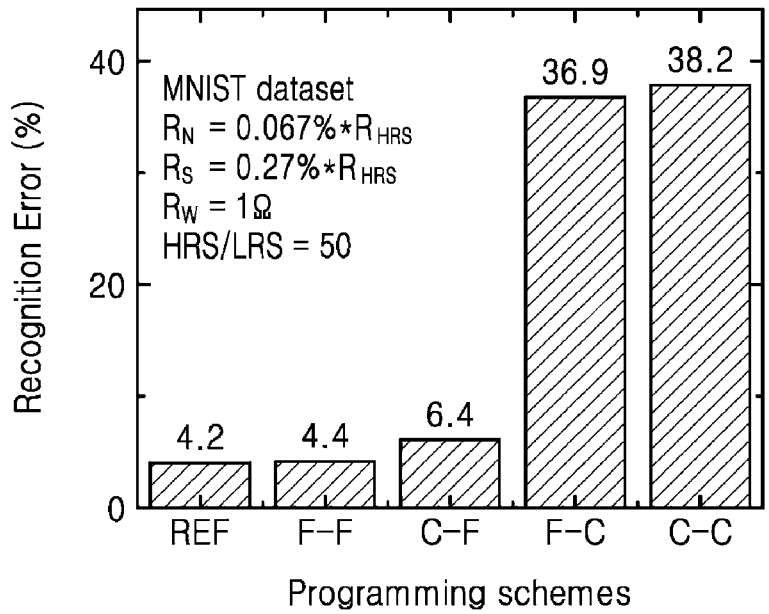
FIGS. 15A and 15B are graphs illustrating a recognition error rate and a recognition error rate in which there is considered energy consumption, when a ratio of HRSs to LRSs is 50 and RW is 1Ω.
Figure 15B:
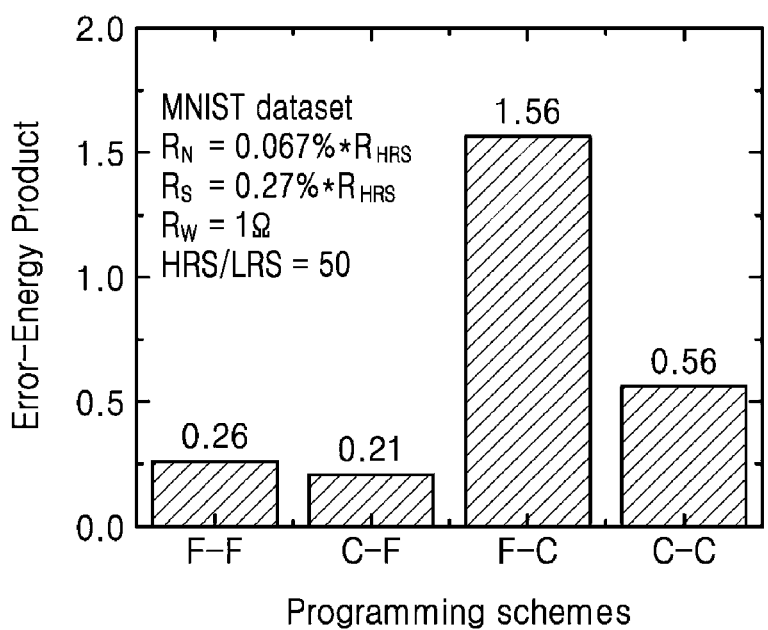

FIG. 15A illustrates a recognition error rate when a ratio of HRSs to LRSs (or HRSs/LRSs) is 50, $R_W$ is 1Ω, $R_S$ is 0.27% of a resistance value RHRS of an HRS, and $R_N$ is 0.067% of a resistance value RHRS of an HRS. In FIG. 15A, a horizontal axis represents program schemes, and a vertical axis represents a recognition error rate. FIG. 15B illustrates a recognition error rate in which there is considered energy consumption, when a ratio of HRSs to LRSs (or HRSs/LRSs) is 50, $R_W$ is 1Ω, $R_S$ is 0.27% of a resistance value RHRS of an HRS, and $R_N$ is 0.067% of a resistance value RHRS of an HRS. In FIG. 15B, a horizontal axis represents program schemes, and a vertical axis represents an error-energy product. In FIGS. 15A and 15B, a resistance value of an HRS may be 50 times a resistance value of an LRS. In FIGS. 15A and 15B, the MNIST dataset was used as input data.

Figure 16A:
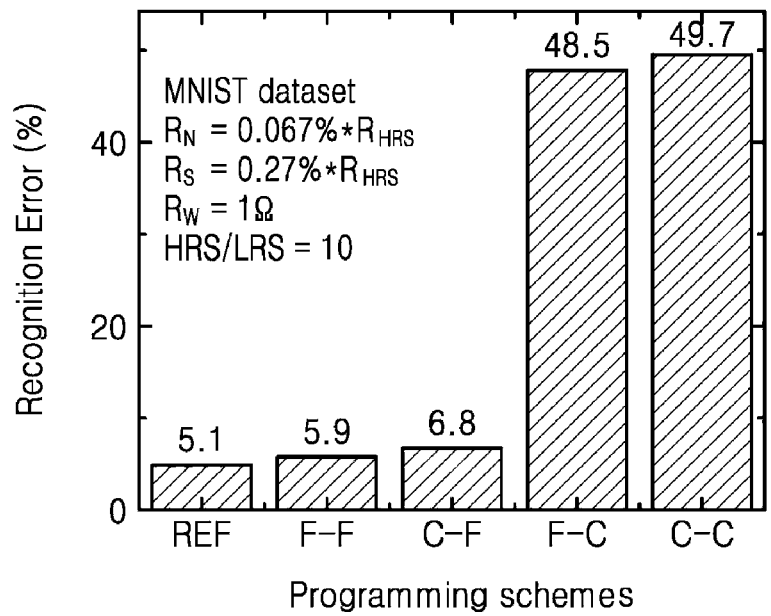
FIGS. 16A and 16B are graphs illustrating a recognition error rate and a recognition error rate in which there is considered energy consumption, when a ratio of HRSs to LRSs is 10 and RW is 1Ω.
Figure 16B:
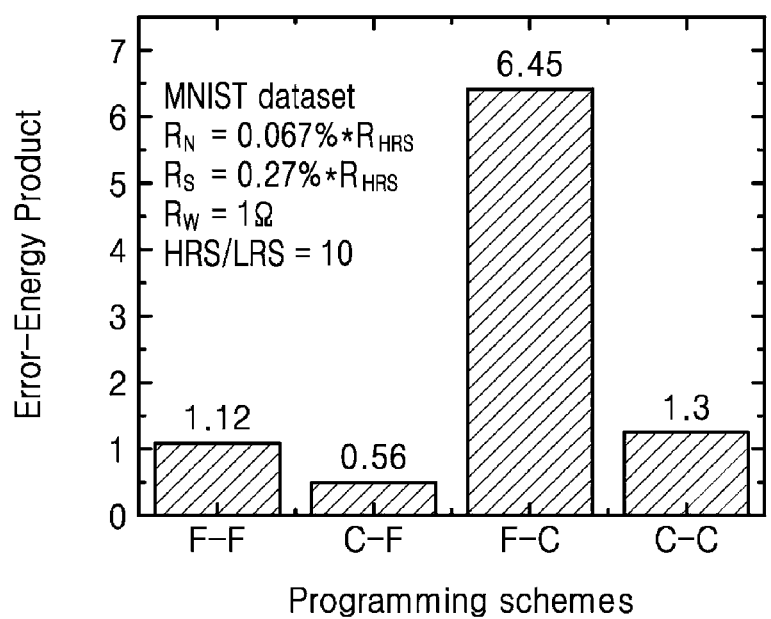

FIG. 16A illustrates a recognition error rate when a ratio of HRSs to LRSs (or HRSs/LRSs) is 10, $R_W$ is 1Ω, $R_S$ is 0.27% of a resistance value RHRS of an HRS, and $R_N$ is 0.067% of a resistance value RHRS of an HRS. In FIG. 16A, a horizontal axis represents program schemes, and a vertical axis represents a recognition error rate. FIG. 16B illustrates a recognition error rate in which there is considered energy consumption, when a ratio of HRSs to LRSs (or HRSs/LRSs) is 10, $R_W$ is 1Ω, $R_S$ is 0.27% of a resistance value RHRS of an HRS, and $R_N$ is 0.067% of a resistance value RHRS of an HRS. In FIG. 16B, a horizontal axis represents program schemes, and a vertical axis represents an error-energy product. In FIGS. 16A and 16B, a resistance value of an HRS may be 10 times a resistance value of an LRS. In FIGS. 16A and 16B, the MNIST dataset was used as input data.

Figure 17A:
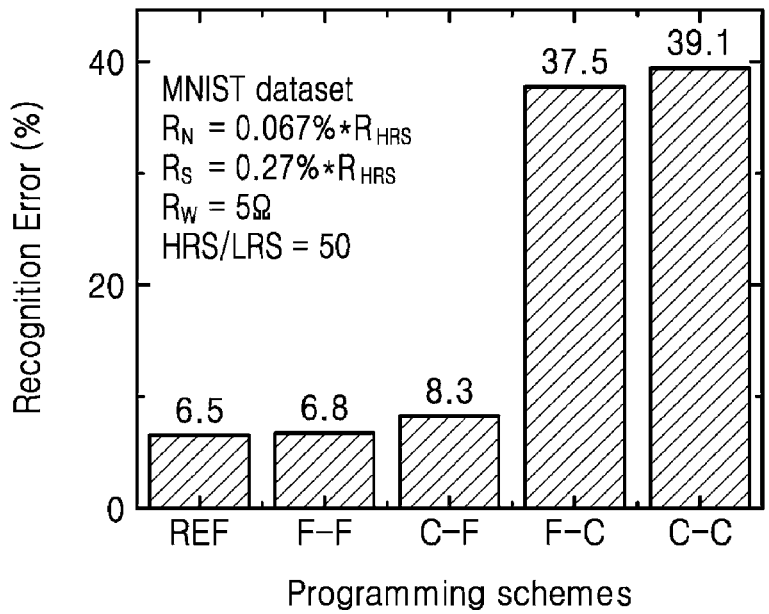
FIGS. 17A and 17B are graphs illustrating a recognition error rate and a recognition error rate in which there is considered energy consumption, when a ratio of HRSs to LRSs is 50 and RW is 5Ω.
Figure 17B:
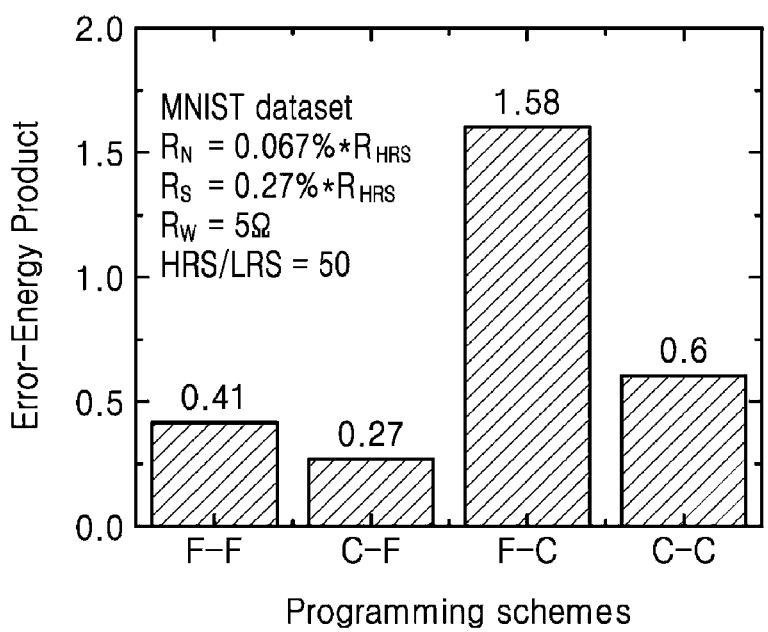

FIG. 17A illustrates a recognition error rate when a ratio of HRSs to LRSs (or HRSs/LRSs) is 50, $R_W$ is 5Ω, $R_S$ is 0.27% of a resistance value RHRS of an HRS, and $R_N$ is 0.067% of a resistance value RHRS of an HRS. In FIG. 17A, a horizontal axis represents program schemes, and a vertical axis represents a recognition error rate. FIG. 17B illustrates a recognition error rate in which there is considered energy consumption, when a ratio of HRSs to LRSs (or HRSs/LRSs) is 50, $R_W$ is 1Ω, $R_S$ is 0.27% of a resistance value RHRS of an HRS, and $R_N$ is 0.067% of a resistance value RHRS of an HRS. In FIG. 17B, a horizontal axis represents program schemes, and a vertical axis represents an error-energy product. In FIGS. 17A and 17B, a resistance value of an HRS may be 50 times a resistance value of an LRS. In FIGS. 17A and 17B, the MNIST dataset was used as input data.

Referring to FIGS. 15A and 15B, FIGS. 16A and 16B, and FIGS. 17A and 17B, "REF" of program schemes indicates a scheme of programming a memristor cell ideally. "F-F" of the program schemes may perform HRS programming with a program voltage pattern of a fine level and LRS programming with a program voltage pattern of a fine level.

"C-F" of the program schemes may perform HRS programming with a program voltage pattern of a coarse level and LRS programming with a program voltage pattern of a fine level. "F-C" of the program schemes may perform HRS programming with a program voltage pattern of a fine level and LRS programming with a program voltage pattern of a coarse level.

"C-C" of the program schemes may perform HRS programming with a program voltage pattern of a coarse level and LRS programming with a program voltage pattern of a coarse level. In FIGS. 15A and 15B, FIGS. 16A and 16B, and FIGS. 17A and 17B, a recognition error rate and a recognition error rate in which energy consumption is considered (i.e., an error-energy product) may be compared.

In the specification, the recognition error rate in which energy consumption is considered is defined as a value that is obtained by multiplying a recognition error rate and energy consumed for a memristor cell to train together.

In the case where energy is not considered, except for the ideal program scheme REF, a recognition error rate of the F-F program scheme is the lowest. However, in the case where energy is considered, a recognition error rate in which energy consumption of the C-F program scheme is considered may be the lowest.

According to an embodiment, when input data have a first value (e.g., "0"), the electronic device 10 may select the first program voltage pattern of a coarse level to program a memristor cell to the HRS; when the input data have a second value (e.g., "1"), the electronic device 10 may select the second first program voltage pattern to program a memristor cell to the LRS.

Figure 18:
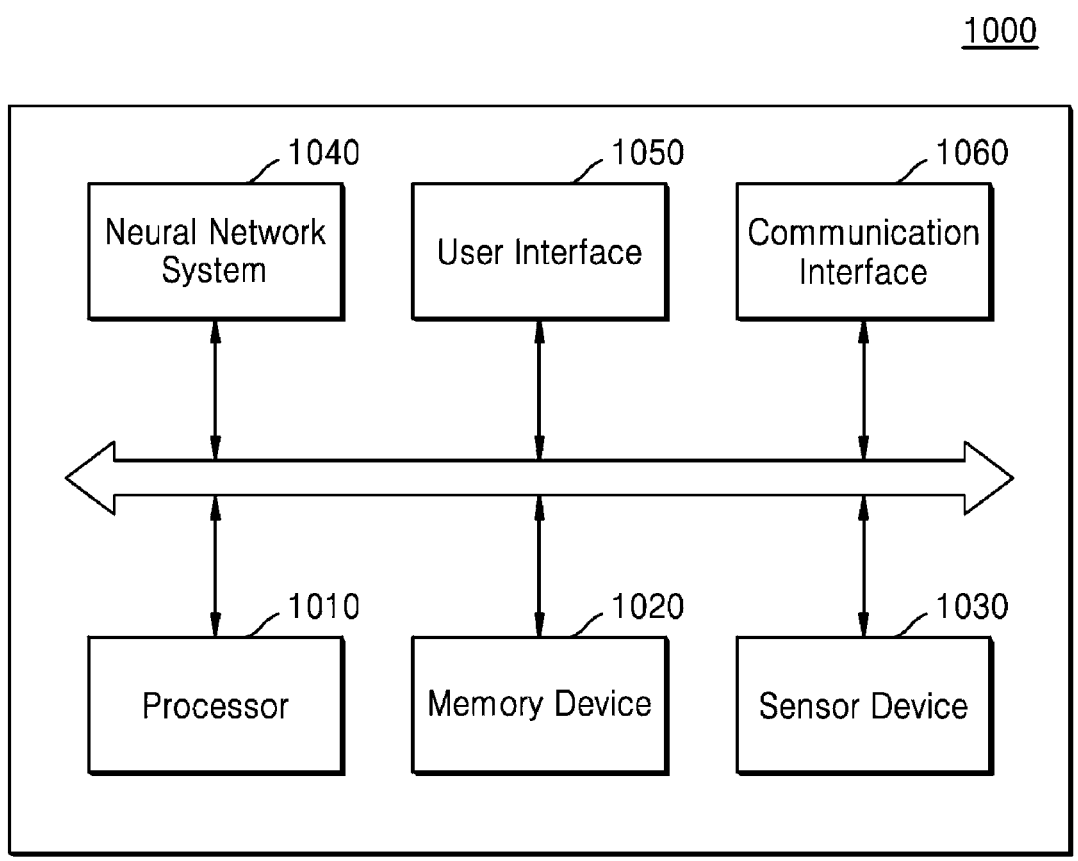
FIG. 18 is a memory system including a neural network system according to an embodiment of the inventive concept.

FIG. 18 is a block diagram illustrating an electronic device including a neural network system according to an embodiment of the inventive concept.

Referring to FIG. 18, an electronic device 1000 may include a processor 1010, a memory device 1020, a sensor device 1030, a neural network system 1040, a user interface 1050, and a communication interface 1060.

A configuration of the electronic device 1000 according to an embodiment is illustrated in FIG. 18. The electronic device 1000 may not include some of the components 1010 to 1060 or may further include any other components. The electronic device 1000 may be implemented with a mobile device such as a smartphone, a smart pad, or a notebook computer, or a stationary device such as a personal computer, a server, or a workstation.

The processor 1010 may control overall operations of the electronic device 1000 and may process data present in the electronic device 1000. The processor 1010 may execute various codes constituting an operating system, an application, firmware, etc.

The memory device 1020 may store data generated in the process of processing data collected in the electronic device 1000 and data processed by the processor 1010. The memory device 1020 may be a working memory or a system memory of the electronic device 1000.

The sensor device 1030 may include various sensors (e.g., an image sensor, a temperature sensor, a humidity sensor, an ultrasonic sensor, an acceleration sensor, an infrared sensor, and a biosensor).

The sensor device 1030 may collect various kinds of sensing data and may transfer the collected sensing data to the memory device 1020 so as to be stored therein.

The neural network system 1040 may include the electronic device 10 according to an embodiment of the inventive concept described with reference to FIGS. 1 to 17. Depending on a request of the processor 1010, the neural network system 1040 may perform learning or inference by using data stored in the memory device 1020 or data transferred through the communication interface 1060. The neural network system 1040 may transfer a result of the learning or inference to the processor 1010. The processor 1010 may instruct the neural network system 1040 by using the learning result. The processor 1010 may display the inference result through the user interface 1050.

The neural network system 1040 may use a coarser program voltage pattern when programming a memristor cell to the HRS. The neural network system 1040 may use a finer program voltage pattern when programming a memristor cell to the LRS. A voltage difference (or a difference between absolute values of voltages or a pulse width time difference) of adjacent voltage pulses of the coarser program voltage pattern for HRS programming on the basis of time may be a first difference. A voltage difference (or a difference between absolute values of voltages or a pulse width time difference) of adjacent voltage pulses of the finer program voltage pattern for LRS programming on the basis of time may be a second difference. The first difference may be greater than the second difference.

The number of voltage pulses used on average when programming a memristor cell to the HRS may be less than the number of voltage pulses used on average when programming a memristor cell to the LRS.

The user interface 1050 may include components that allow a user to manipulate the electronic device 1000. The user interface 1050 may include a physical button, a keyboard, a keypad, a mouse, a microphone, a touch panel, etc. The user interface 1050 may further include components that are used for the electronic device 1000 to provide information to the user. The user interface 1050 may further include a monitor, a projector, a lamp, a printer, a speaker, etc.

The communication interface 1060 may transmit data stored, processed, or learned by the electronic device 1000 to any other electronic device or may receive data or a control command from any other electronic device. The communication interface 1060 may include an antenna, a modem, etc. for the purpose of performing communication.

Figure 19:
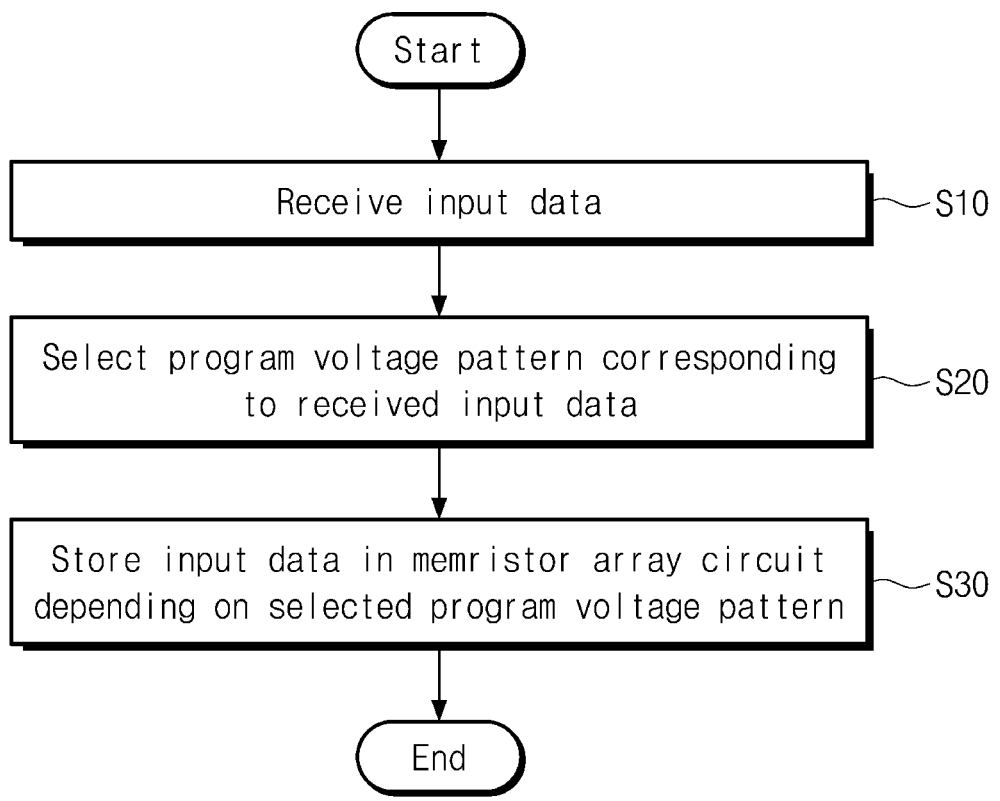
FIG. 19 is a flowchart of an operating method of a memory device according to an embodiment of the inventive concept.

FIG. 19 is a flowchart of an operating method of the electronic device 10 according to an embodiment of the inventive concept.

Referring to FIGS. 1 to 19, the electronic device 10 according to an embodiment of the inventive concept may receive input data (S10).

According to an embodiment, the input data may be sensing data.

The electronic device 10 may select a program voltage pattern corresponding to the received input data from among a plurality of program voltage patterns (S20).

According to an embodiment, each of the plurality of program voltage patterns may include a plurality of voltage pulses in which a pulse magnitude gradually increases over time.

According to an embodiment, the plurality of program voltage patterns may be set in such a way that a voltage difference of adjacent voltage pulses is not identical (i.e., pulse voltage differences of the plurality of program voltage patterns are different).

According to an embodiment, each of the plurality of program voltage patterns may be set to include a different number of voltage pulses. For example, in the case where the plurality of program voltage patterns include a first program voltage pattern and a second program voltage pattern, the number of voltage pulses of a first program voltage pattern may be different the number of voltage pulses of a second program voltage pattern.

According to an embodiment, the plurality of program voltage patterns may include at least one program voltage pattern for programming a memristor cell to the HRS and at least one program voltage pattern for programming a memristor cell to the LRS. In this case, voltage pulses included in the program voltage pattern for the programming of the memristor cell to the HRS may have a positive voltage value, and voltage pulses included in the second program voltage pattern for the programming of the memristor cell to the LRS may have a negative voltage value.

According to another embodiment, the electronic device 10 may select one of the plurality of program voltage patterns based on the received input data and a user input.

For example, when the received input data are "1" and the user input is a first input, the electronic device 10 may select a first program voltage pattern; when the received input data are "1" and the user input is a second input, the electronic device 10 may select a second program voltage pattern. When the received input data are "0" and the user input is the first input, the electronic device 10 may select a third program voltage pattern; when the received input data are "0" and the user input is the second input, the electronic device 10 may select a fourth program voltage pattern. In this case, the first program voltage pattern to the fourth program voltage pattern may be set in such a way that a voltage difference of adjacent voltage pulses is not identical (i.e., pulse voltage differences of the first to fourth program voltage patterns are different) and a different number of voltage pulses are included in each of the first to fourth program voltage patterns.

The user input may be used to set an operating mode of the electronic device 10. The first input of the user may be used to set the operating mode of the electronic device 10 to a first mode. The second input of the user may be used to set the operating mode of the electronic device 10 to a second mode. The electronic device 10 may use a different program voltage pattern depending on whether the electronic device 10 is in the first mode or in the second mode. Depending on whether the electronic device 10 is in the first mode or in the second mode, the electronic device 10 may use "finer" or "less fine" program voltage patterns compared to any other mode.

According to another embodiment, the electronic device 10 may select one of the plurality of program voltage patterns based on the received input data and an operating mode. The operating mode may be determined as a high-accuracy operating mode or a low-accuracy operating mode depending on a quality of service (QoS) required with regard to the electronic device 10. The electronic device 10 may receive QoS information transmitted from an external device of the electronic device 10. According to an embodiment, a first voltage difference of voltage pulses consecutive in a program voltage pattern selected in the low-accuracy operating mode may be greater in value than a second voltage difference of voltage pulses consecutive in a program voltage pattern selected in the high-accuracy operating mode.

As described above, the electronic device 10 may store a plurality of pairs of information of program voltage patterns. The electronic device 10 may select at least one of the plurality of pairs of program voltage patterns depending on a user input or a required QoS. The electronic device 10 may program a memristor cell to the HRS by using one of program voltage patterns of the selected pair and may program a memristor cell to the LRS by using the other of the program voltage patterns of the selected pair (S30).

For another example, the electronic device 10 may operate in one of a high-reliability mode and a low-power mode, depending on a user input, depending on a required QoS, or depending on the level of degradation of the electronic device 10. In the high-reliability mode, the electronic device 10 may program a memristor cell by using the F-F program scheme. In the low-power mode, the electronic device 10 may program a memristor cell by using the C-F program scheme.

For another example, the electronic device 10 may operate in one of a high-speed mode and a high-reliability mode, depending on a user input, depending on a required QoS, or depending on the level of degradation of the electronic device 10. In the high-speed mode, the electronic device 10 may program a memristor cell by using the C-C program scheme. In the high-reliability mode, the electronic device 10 may program a memristor cell by using the C-F (or F-F) program scheme as described above.

For another example, the electronic device 10 may operate in one of three or more modes, depending on a user input, depending on a required QoS, or depending on the level of degradation of the electronic device 10. In one mode, the electronic device 10 may program a memristor cell by using the F-F program scheme. In another mode, the electronic device 10 may program a memristor cell by using the C-F program scheme. In another mode, the electronic device 10 may program a memristor cell by using the C-C program scheme. That is, the electronic device 10 may select one of a plurality of program schemes in which at least one of a scheme of programming a memristor cell to the HRS and a scheme of programming a memristor cell to the LRS is variable.

In an additional example, in the electronic device 10, each of program schemes such as F-F, C-F, and C-C may include two or more sub-program schemes in which a fine level of "F" and a coarse level of "C" are variable. The electronic device 10 may select a program scheme, may then additionally select a sub-program scheme, and may then program a memristor cell. Alternatively, the electronic device 10 may select a program scheme, may then adjust a fine level of "F" and a coarse level of "C", and may then program a memristor cell.

Methods and devices according to embodiments of the inventive concept make it possible to reduce a time and energy necessary for programming without a great increase of a memristor program error by selecting a program voltage pattern corresponding to input data and programming a memristor cell by using the selected program voltage pattern.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An operating method of an electronic device, the method comprising:
   receiving input data;
   selecting a program voltage pattern corresponding to the input data from among a plurality of program voltage patterns for storing the input data in a memristor array circuit; and
   storing the input data in the memristor array circuit based on the selected program voltage pattern,
   wherein each of the plurality of program voltage patterns includes a plurality of voltage pulses in which a pulse magnitude gradually increases over time, and
   wherein a first voltage difference between adjacent voltage pulses in a first program voltage pattern of the plurality of program voltage patterns is different from a second voltage difference of adjacent voltage pulses in a second program voltage pattern of the plurality of program voltage patterns.

2. The method of claim 1, wherein the selecting of the program voltage pattern includes:
   when the input data have a first value, selecting the first program voltage pattern; and
   when the input data have a second value, selecting the second program voltage pattern.

3. The method of claim 2, wherein, when the input data have the first value, a corresponding cell of the memristor array circuit is programmed to a high resistance state (HRS), and
   wherein, when the input data have the second value, the corresponding cell of the memristor array circuit is programmed to a low resistance state (LRS).

4. The method of claim 3, wherein the first voltage difference of adjacent voltage pulses in the first program voltage pattern is greater than the second voltage difference of adjacent voltage pulses in the second program voltage pattern.

5. The method of claim 3, wherein a number of voltage pulses included in the first program voltage pattern is less than a number of voltage pulses included in the second program voltage pattern.

6. The method of claim 1, wherein, depending on values stored in two adjacent memristor cells in a same row of the memristor array circuit, a value stored in the two adjacent memristor cells is a value of "1", "0", or "−1".

7. The method of claim 6, wherein, when all the two memristor cells are programmed to an HRS, the value stored in the two memristor cells is "0",
   wherein, when a memristor cell placed on one side from among the two memristor cells is programmed to an LRS and a memristor cell placed on an opposite side from among the two memristor cells is programmed to the HRS, the value stored in the two memristor cells is "1", and
   wherein, when the memristor cell placed on the one side from among the two memristor cells is programmed to the HRS and the memristor cell placed on the opposite side from among the two memristor cells is programmed to the LRS, the value stored in the two memristor cells is "−1".

8. The method of claim 7, wherein the two memristor cells store at least a portion of a synaptic weight of a neural network.

9. The method of claim 1, wherein the selecting of the program voltage pattern includes:
   selecting the program voltage pattern based on the input data and an input of a user.

10. The method of claim 1, wherein the operating mode is determined as one of a high-accuracy operating mode and a low-accuracy operating mode, depending on a quality of service (QoS) required with regard to the electronic device.

11. The method of claim 10, wherein a first voltage difference of consecutive voltage pulses in a program voltage pattern selected in the low-accuracy operating mode from among the plurality of program voltage patterns is greater than a second voltage difference of consecutive voltage pulses in a program voltage pattern selected in the high-accuracy operating mode from among the plurality of program voltage patterns.

12. An electronic device comprising:
   a memristor array circuit; and
   a memristor array controlling circuit configured to store input data in the memristor array circuit depending on a program voltage pattern, which is selected to correspond to the input data, from among a plurality of program voltage patterns for storing the input data in the memristor array circuit,
   wherein each of the plurality of program voltage patterns includes a plurality of voltage pulses in which a pulse magnitude gradually increases over time, and
   wherein a first voltage difference between adjacent voltage pulses in a first program voltage pattern of the plurality of program voltage patterns is different from a second voltage difference of adjacent voltage pulses in a second program voltage pattern of the plurality of program voltage patterns.

13. The electronic device of claim 12, wherein the memristor array controlling circuit selects one of a plurality of program schemes and selects a program voltage pattern corresponding to the input data from among program voltage patterns belonging to the selected program scheme.

14. The electronic device of claim 13, wherein at least one of a scheme of programming a memristor cell of the memristor array circuit to a high resistance state (HRS) and a scheme of programming the memristor cell to a low resistance state (LRS) is different among the plurality of program schemes.

15. The electronic device of claim 12, wherein the memristor array controlling circuit adjusts a fine level of the selected program voltage pattern.

16. The electronic device of claim 12, wherein, after the input data are stored in the memristor array circuit, the memristor array controlling circuit calculates second input data and at least a portion of the input data stored in the memristor array circuit.

17. The electronic device of claim 16, wherein the memristor array controlling circuit calculates a result of the calculation as third input data and at least another portion of the input data stored in the memristor array circuit.

18. An electronic device comprising:
a memory device configured to store data;
a processor configured to use the memory device as a working memory; and
a neural network system configured to perform learning or inference by using the data stored in the memory device depending on a request of the processor,
wherein the neural network system includes:
a memristor array circuit; and
a memristor array controlling circuit configured to store input data in the memristor array circuit depending on a program voltage pattern, which is selected to correspond to the input data, from among a plurality of program voltage patterns for storing the input data in the memristor array circuit,
wherein each of the plurality of program voltage patterns includes a plurality of voltage pulses in which a pulse magnitude gradually increases over time, and
wherein a first voltage difference between adjacent voltage pulses in a first program voltage pattern of the plurality of program voltage patterns is different from a second voltage difference of adjacent voltage pulses in a second program voltage pattern of the plurality of program voltage patterns.

* * * * *